United States Patent
Bailly et al.

(10) Patent No.: US 7,054,171 B1
(45) Date of Patent: May 30, 2006

(54) LIMITING THE CONTINUOUS MODE OF A POWER CONVERTER

(75) Inventors: Alain Bailly, Rousset (FR); Jean Barret, Eguilles (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/381,967

(22) PCT Filed: Sep. 28, 2000

(86) PCT No.: PCT/FR00/02684

§ 371 (c)(1),
(2), (4) Date: Mar. 28, 2003

(87) PCT Pub. No.: WO02/27906

PCT Pub. Date: Apr. 2, 2002

(51) Int. Cl.
*H02M 3/335* (2006.01)
*H03K 3/00* (2006.01)

(52) U.S. Cl. ..................... 363/21.8; 327/110
(58) Field of Classification Search .................. 363/21, 363/13, 41, 97, 16, 20, 21.15, 56, 21.8, 21.9, 363/19, 95, 21.12, 21.4; 323/282, 283, 284, 323/285; 327/110, 134, 427, 312, 327, 309
See application file for complete search history.

(56) References Cited

U.S. PATENT DOCUMENTS

| 4,288,831 | A | * | 9/1981 | Dolikian | 361/92 |
|---|---|---|---|---|---|
| 4,581,551 | A | * | 4/1986 | Campbell, Jr. | 326/80 |
| 4,716,510 | A | * | 12/1987 | Pace et al. | 363/49 |
| 4,763,238 | A | * | 8/1988 | Maige | 363/56.1 |
| 5,073,850 | A | * | 12/1991 | Pace | 363/89 |
| 5,335,162 | A | * | 8/1994 | Martin-Lopez et al. | 363/97 |
| 5,349,515 | A | * | 9/1994 | Megeid | 363/21.11 |
| 5,663,667 | A | * | 9/1997 | Blum et al. | 327/134 |
| 5,757,214 | A | * | 5/1998 | Stoddard et al. | 327/110 |
| 5,757,625 | A | | 5/1998 | Schoofs | |
| 6,061,257 | A | | 5/2000 | Spampinato et al. | |

FOREIGN PATENT DOCUMENTS

EP   0 529 366 A1   3/1993

OTHER PUBLICATIONS

International Search Report from PCT priority application No. PCT/FR00/02684.

* cited by examiner

*Primary Examiner*—Rajnikant B. Patel
(74) *Attorney, Agent, or Firm*—Lisa K. Jorgenson; James H. Morris; Wolf, Greenfield & Sacks, P.C.

(57) ABSTRACT

The invention concerns a control circuit (20) of a switch (6) chopping a voltage supply of a primary winding of a power converter transformer, comprising means (45) for detecting the current in the switch in closed state after a predetermined time following each closure of said switch, and a comparator (40) of said current relative to a threshold (Ilim), the result of said comparator being taken into account for a predetermined time interval close to the beginning of a closing cycle of said chopping switch.

18 Claims, 2 Drawing Sheets

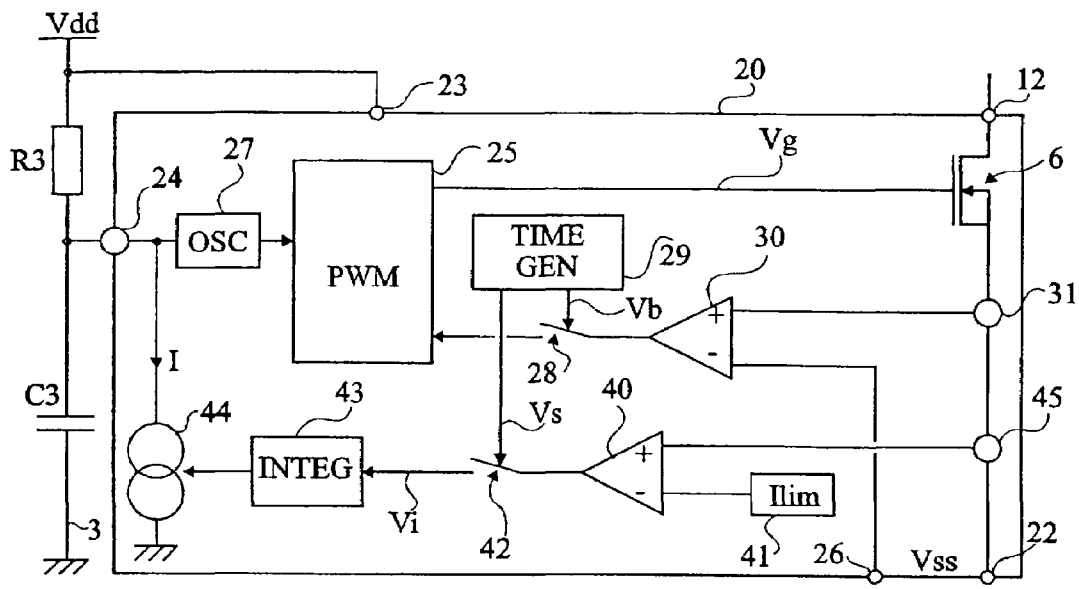
Fig 4
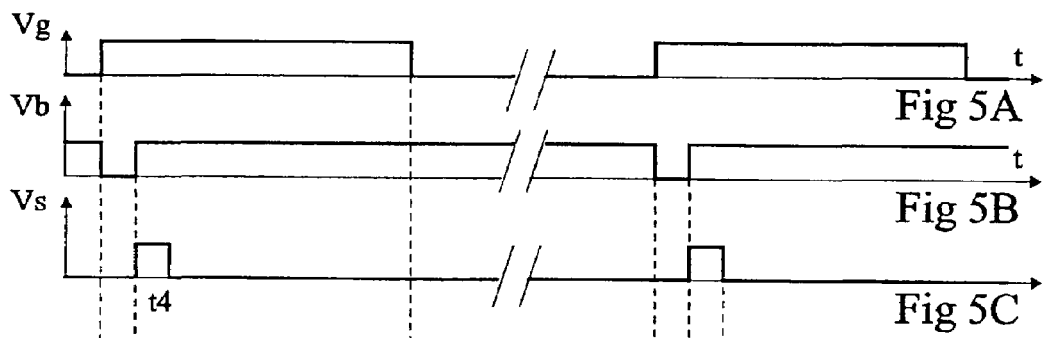
Fig 5A
Fig 5B
Fig 5C
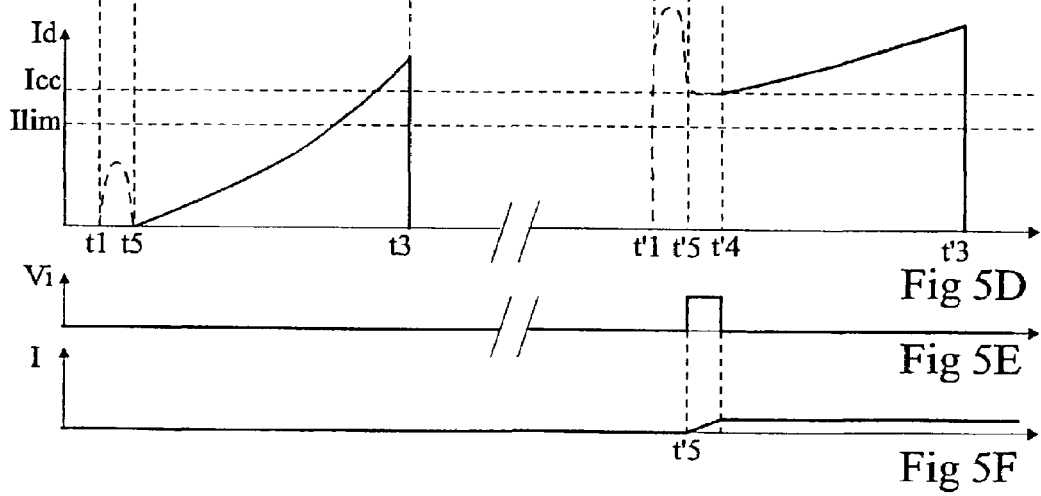
Fig 5D
Fig 5E
Fig 5F
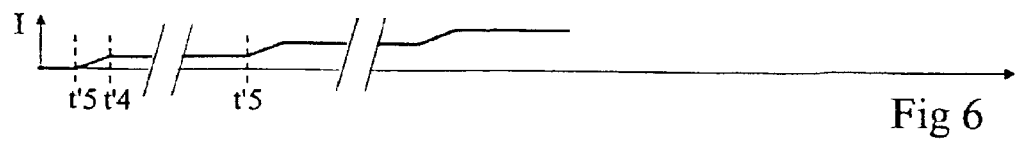
Fig 6

LIMITING THE CONTINUOUS MODE OF A POWER CONVERTER

BACKGROUND OF THE INVENTION

1. Field of the Invention

The present invention relates to the field of power converters of low voltage switched-mode power supply type. The present invention more specifically applies to isolated power supplies, that is, supplies that have no common point between the input voltage (for example, the A.C. supply system) and the regulated D.C. output voltage. The isolation is obtained by means of a transformer having a primary winding associated with a pulse-width modulation controlled switch, and having a secondary winding associated with a diode and with a capacitor providing the output voltage.

2. Discussion of the Related Art

FIG. 1 shows a conventional example of a switched-mode power supply of the type to which the present invention applies. Two input terminals P, N receive an A.C. voltage Vac, for example, the mains voltage. Voltage Vac undergoes a rectification, for example a fullwave rectification by means of a diode bridge 1. The A.C. input terminals of bridge 1 are connected to terminals P and N, and its rectified output terminals 2, 3 provide a voltage Vr. Voltage Vr is generally smoothed by means of a capacitor C1 connected between terminals 2 and 3 which form the input terminals of the actual switched-mode power supply.

The converter of FIG. 1 is a so-called flyback converter in which a transformer 4 with inverted phase points has its primary winding 5 connected in series with a switch 6 between terminals 2 and 3. The phase point of winding 5 is connected to a terminal of switch 6, the other terminal of which is connected to terminal 3. Switch 6 is connected in switched mode and at a non-audible high frequency (generally greater than 20 kHz). A secondary winding 7 of transformer 4 is associated with a capacitor C2 across the terminals Sp and Sn of which is provided D.C. output voltage Vout. The phase point of winding 7 is connected to terminal Sp by a diode D1, the cathode of diode D1 being connected to terminal Sp. The other terminal of winding 7 is connected to terminal Sn. Ground terminals 3 and Sn are isolated from each other by means of a capacitor Ci.

When switch 6 is on, the phase point of winding 7 is at a negative potential. Diode D1 thus is off and a current is stored in primary winding 5. Upon turning off of switch 6, the phase points of windings 5 and 7 both become positive. Diode D1 is forward biased. Capacitor C2 is then charged with the power transferred to secondary winding 7.

Switch 6 (for example, a MOS transistor) is, in the example of FIG. 1, integrated in a circuit 10 with its electronic control circuit. An example of such an integrated circuit, sold by STMicroelectronics Company, is known under trade name VIPER. Circuit VIPER is comprised of an input terminal Vdd intended for receiving a positive power supply, a voltage reference terminal Vss connected to ground 3, and a terminal OSC conditioning an oscillation frequency. Circuit 10 further includes a terminal COMP for compensating the regulation loop, connected by a resistor R5 in series with a capacitor C5 to ground 3. Finally, a terminal 12 is connected to the drain of the integrated N-channel transistor, the source of which is connected to terminal Vss. The gate of transistor 6 is connected at the output of a control circuit 11 (CTRL). Circuit 11 includes a comparator (not shown), a first input of which receives an internal voltage reference and a second input of which is connected, internally, to the positive supply terminal. The control, that is, the modification of the width of control pulses of switch 6, is performed by for example using a loop of regulation of integrated circuit 10, which attempts maintaining its supply voltage (Vdd-Vss). This type of regulation is performed on the primary side of the transformer. The output voltage may also be regulated based on a measurement on the secondary side, transferred to circuit 10 by a galvanic isolation element (for example, an optocoupler). Terminal OSC is connected to the midpoint of a series association of a resistor R3 and of a capacitor C3 between a line 13 of local supply of circuit 10 and the ground. Resistor R3 and capacitor C3 set the oscillation frequency. A capacitor C4 for filtering the local supply voltage is connected between terminal 13 and terminal 3.

A problem which arises in flyback-type converters is that, when a short-circuit occurs at the output of the power converter, diode D1 and transformer 4 are not protected. They thus risk being damaged under the effect of the strong current that flows through the transformer. Further, a melting of the transformer breaks the galvanic isolation, which is particularly dangerous if the power converter is supplied by the mains. Standards generally determine the short-circuit strength duration of a power converter of this type.

In an application to a switched-mode converter, local supply line 13 of circuit 10 is often connected, as illustrated in FIG. 1, by a diode D2, to the phase point of an auxiliary winding 8 of transformer 4. In this case, the other terminal of auxiliary winding 8 is connected to reference terminal 3 of the rectified voltage. Auxiliary winding 8 has the function of providing supply voltage Vdd of circuit 10. The output voltage then is set by the transformation ratio between auxiliary winding 8 and secondary winding 7. Auxiliary winding 8, which gives an image of the output voltage, is used, said winding being in direct phase relation with secondary winding 7.

In such an assembly, a current detector (not shown) may be provided in series with switch 6. The result of the detection is then provided to a comparator which, by means of adapted logic circuits, opens switch 6 when the current exceeds a threshold. The amount of power transmitted to the secondary is thus reduced. Further, since auxiliary winding 8 is in direct phase relation with secondary winding 7, the voltage drop which appears across the secondary winding is, after a time depending on the value of capacitor C4, seen by the supply line of circuit 10. The supply of circuit 10 becomes insufficient for its operation, which guarantees the turning off of switch 6.

FIGS. 2, 3A, 3B, and 3C illustrate the operation of such a power converter in normal state and in short-circuit at the secondary. FIG. 2 illustrates an example of the shape of voltage VAUX across auxiliary winding 8 in normal operation. FIGS. 3A, 3B, and 3C respectively show the course of voltage VAUX, of current 1 in switch 6 and of local supply voltage Vdd of circuit 10 when the secondary of the transformer is short-circuited.

In normal operation, upon each turning-off (times t1) of switch 6, voltage VAUX abruptly increases from a negative value to a demagnetization value VDEM. Value VDEM is only reached after a few spurious oscillations associated with the turning-off of switch 6. Once the demagnetization is complete, voltage VAUX drops (times t2) and exhibits oscillations centered on the voltage zero until the turning-on (times t3) of switch 6 where voltage VAUX becomes negative again. The same waveform is obtained across secondary winding 7, before the voltage is filtered by capacitor C2.

When a short-circuit is present between terminals Sp and Sn (FIGS. 3A to 3C), the current in switch 6 is limited to a value Imax (times t10 to t11) by the previously-described detection circuit. Supply voltage Vdd of circuit 10 then progressively decreases (FIG. 3C). This progressive decrease reaches a threshold (VddOFF) below which circuit 10 no longer receives the sufficient voltage. From this time t11 on, switch 6 remains off and no current is transmitted to the secondary. However, this restarts the starting circuit generally associated with the power converter. This restarting causes a progressive increase of local supply voltage Vdd. When this voltage reaches (time t12) the operating threshold (VddON) of circuit 10, high current surges occur again (times t12 to t13). Voltage VAUX (FIG. 3A) exhibits oscillations for each current peak.

The scale is different between FIG. 2 and FIGS. 3A to 3C. In FIG. 2, the switched mode period (on the order of 10 microseconds) of the supply voltage has been shown. In FIGS. 3A to 3B, the time interval separating times t10 and t11 during which the decrease of local supply voltage Vdd takes several switching cycles and lasts, for example, for approximately 100 milliseconds, has been shown.

To respect the standards, a duty ratio that enables the transformers to withstand the high currents Imax (FIG. 3B) which, even though they are limited, are much greater than nominal current Inom of normal converter operation. For example, for a nominal current of 2 amperes, the limiting current is on the order of 10 amperes.

A problem that remains in this conventional solution is that transformer 4 is still urged at its maximum power. Accordingly, the auxiliary winding generates spurious noise (FIG. 3A). This noise is also present in normal state but its amplitude is much greater for a short-circuit of the secondary. Accordingly, although the auxiliary voltage drops, amplitudes sufficient for an autonomous supply of the control circuit are often present.

Another problem is linked to the minimum conduction duration of switch 6. Indeed, it must be possible to turn off switch 6 sufficiently rapidly after each turning-on, otherwise the demagnetization under the low local supply voltage of the auxiliary circuit cannot be performed, and the current is then no longer controlled.

SUMMARY OF THE INVENTION

The present invention aims at providing a power converter of isolated switched-mode power supply type, which overcomes the disadvantages of known converters and, more specifically, which withstands a short-circuiting of its output terminals.

A first solution would be to have the restarting of the starting circuit of the converter switch be conditioned by a complete demagnetization of the auxiliary winding. By detecting the end of the demagnetization, it would be ensured that the converter no longer is in a continuous mode operation (non demagnetized at each cycle). The control of the auxiliary voltage, that is, of the demagnetization point, guarantees the control of the current in the switch. The frequency of circuit 10 can thus be decreased, which results in less current peaks. Further, the problem of switching to a continuous mode is suppressed since the converter is maintained in a discontinuous mode.

However, such a solution requires being able to measure the auxiliary voltage. Now, when the switch and its control circuit are integrated, as is the case in a VIPER circuit, no terminal of access to this auxiliary voltage is available.

Another disadvantage is that by forbidding an operation in continuous mode, the forming of a bi-voltage converter (220 or 110 volts) is also forbidden. Indeed, in bi-voltage converters, a discontinuous operating mode is generally provided for 220 volts, a continuous operating mode being provided for 110 volts.

Thus, the present invention also aims at providing a solution which is compatible with an integration of the control circuit of the switch, more specifically, with an integrated circuit of VIPER type and the corresponding number of terminals. The present invention also aims at providing a solution that enables operation in continuous mode of the converter.

More specifically, the present invention provides a circuit for controlling a switch for cutting-up a supply voltage of a primary winding of a power converter transformer, including means for detecting the current in the switch in the on state after a predetermined time that follows each turning-on of said switch, and a comparator of this current with respect to a threshold, the result of said comparator being taken into account for a predetermined duration in the vicinity of the beginning of an on cycle of said switch.

According to an embodiment of the present invention, said result is taken into account with a predetermined delay with respect to the turn-on time of the switch.

According to an embodiment of the present invention, the circuit includes means for modifying a switching frequency of the supply voltage according to the result provided by said comparator.

According to an embodiment of the present invention, the circuit is integrated with the switch.

According to an embodiment of the present invention, said current threshold is chosen to allow or not the operation of the converter in continuous mode.

The present invention also provides a voltage converter including a circuit for controlling a switch for providing current to a primary winding of a transformer with inverted phase points, a winding of which is associated with a capacitor for providing a regulated D.C. output voltage.

According to an embodiment of the present invention, an input terminal of the control circuit intended for setting the oscillation voltage is connected to a supply voltage by a resistor, the value of which is chosen according to a desired minimum switching frequency.

The foregoing and other objects, features and advantages of the present invention, will be discussed in detail in the following non-limiting description of specific embodiments in connection with the accompanying drawings, wherein:

BRIEF DESCRIPTION OF THE DRAWINGS

FIG. 4 shows, in the form of blocks, an embodiment of an integrated circuit of a power converter according to the present invention; and FIGS. 5A, 5B, 5C, 5D, 5E, and 5F and 6 illustrate, in the form of timing diagrams, the operation of a control circuit according to the present invention.

DETAILED DESCRIPTION

Figure 1:
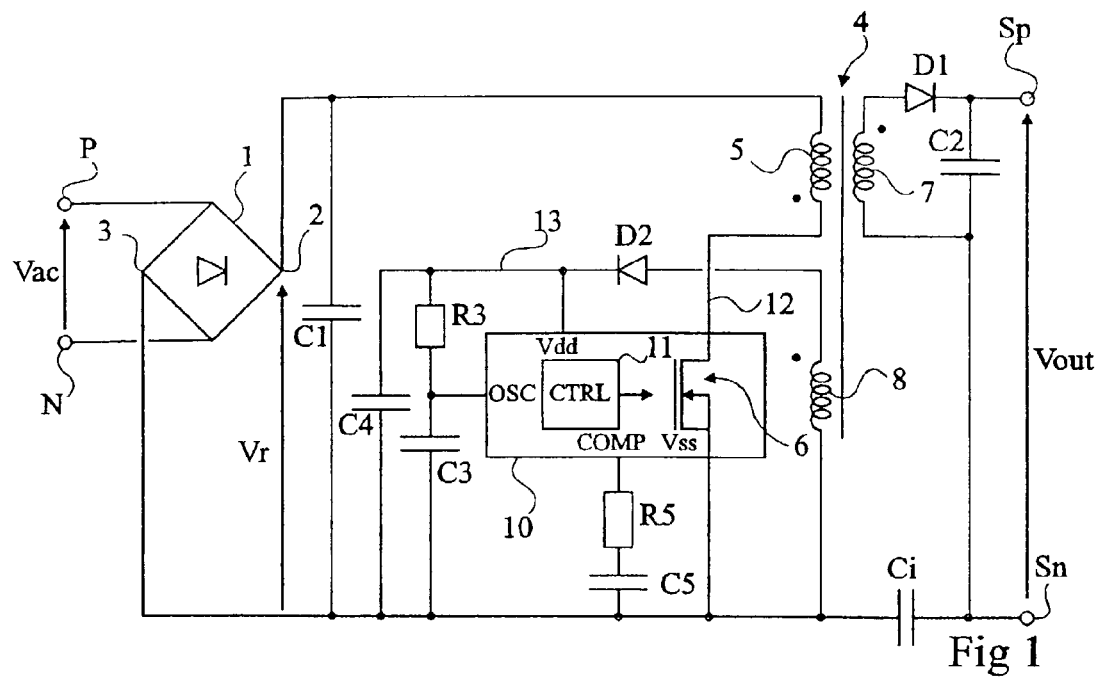
FIGS. 1, 2, 3A, 3B, and 3C, previously described, are intended for showing the state of the art and the problem to solve.
Figure 2:
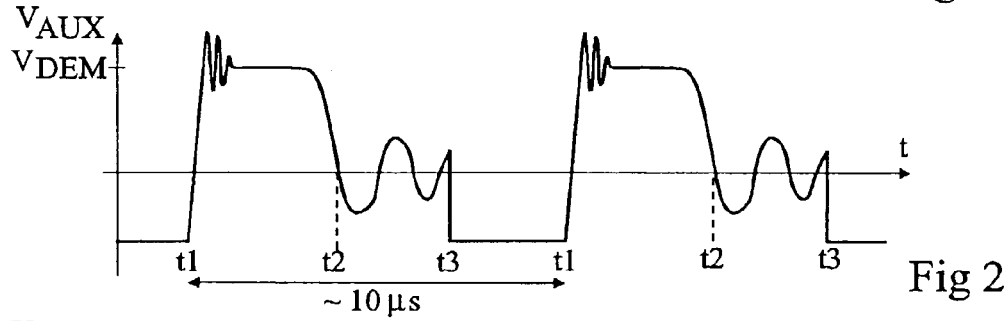
Figure 3A:
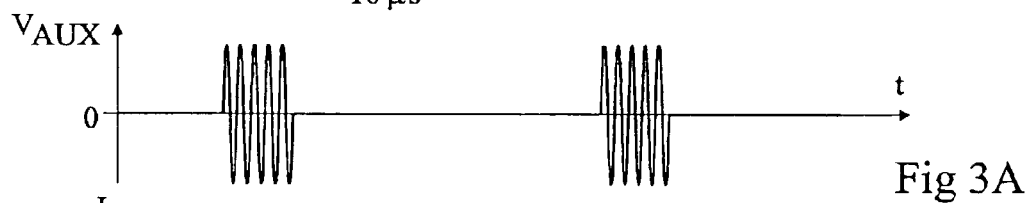
Figure 3B:
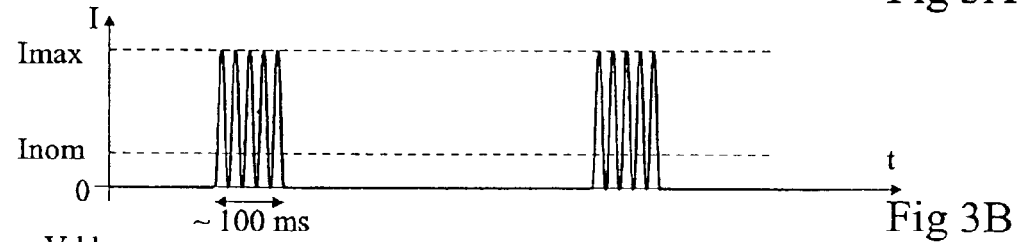
Figure 3C:
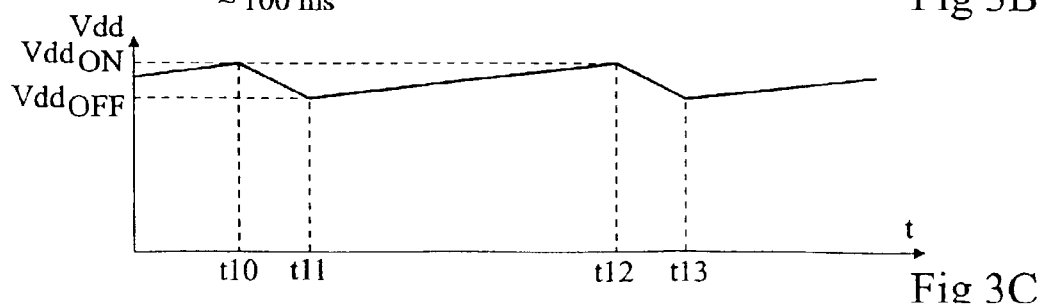

The same elements have been designated with the same references in the different drawings. FIGS. 2, 3A to 3C, 5A to 5F and 6 are not to scale. For clarity, only those elements of the converter which are necessary to the understanding of the present invention have been shown in the drawings and will be described hereafter. In particular, the internal structure of a VIPER-type integrated circuit has only been detailed for the elements useful to the discussion of the present invention. The rest of its structures, as well as the operation of such a circuit, is known.

FIG. 4 shows an embodiment of a control circuit of a supply voltage cut-up switch according to the present invention. The example of FIG. 4 relates to the case of a circuit 20 integrating switch 6 (for example, an N-channel MOS transistor). This circuit is comprised, for example, of the components integrated in a known VIPER circuit.

As previously, and although this is not shown in FIG. 4, a circuit according to the present invention belongs to a converter receiving, as an input, a rectified and filtered voltage. This voltage is obtained, for example, by rectifying and filtering an A.C. supply voltage. However, the input voltage may as an alternative come from any supply source, including a D.C. source.

Conventionally, switch 6 is connected in series with a primary winding (5, FIG. 1) of an isolation transformer between the terminals of application of the input voltage. Switch 6 is controlled in pulse-width modulation at a relatively high frequency (for example, several tens of kilohertz). A terminal 12 of integrated circuit 20 corresponds to the drain of transistor 6 and is intended for being connected to the phase point of the primary winding. A terminal 22 of circuit 20 corresponds to a voltage reference terminal Vss, intended for being connected to the reference potential of the input voltage (terminal 3, FIG. 1). Circuit 20 is supplied by a low D.C. voltage Vdd. This voltage is, as previously, recovered across an auxiliary winding (8, FIG. 1) of the transformer. The auxiliary winding is, in the implementation of the present invention, in direct phase relation with a secondary winding of the transformer which provides the regulated D.C. output voltage. The means used to recover voltage Vdd are, for example, formed of capacitor C4 and of diode D2 shown in FIG. 1.

Local supply voltage Vdd is also provided to a terminal 23 of circuit 20. It further supplies a series association of a resistor R3 with a capacitor C3, the midpoint of which is connected to terminal 24 used to set the oscillation voltage of circuit 20.

Switch 6 is controlled by a signal Vg applied on the gate of the MOS transistor. Signal Vg is provided by a conventional circuit 25 (PWM) intended for modifying the width of the control pulses of transistor 6 to regulate the output voltage of the converter. In practice, circuit 25 includes, among others, a comparator receiving as an input an integrated reference voltage and supply voltage Vdd (or a voltage proportional thereto). The comparator is associated at its output to a current source controlled according to the signal present on a terminal 26 of circuit 20. Terminal 26 is for example connected, as in FIG. 1, to ground 3 by a resistor R5 in series with a capacitor C5 which take part in the regulation loop. Terminal 26 corresponds, internally, to the output of an error amplifier of the regulation loop. Circuit 25 further receives an oscillation frequency from a block OSC 27, the input of which is connected to terminal 24. The details constitutive of circuit 25 have not been shown and are no object of the present invention.

To perform the function of limiting the current in switch 6 in the on state, circuit 20 includes a comparator 30 having a non-inverting input connected to an element 31 for measuring the current in switch 6 and its inverting input connected to terminal 26. Element 31 measures, for example, the source current of transistor 6 and converts it into a voltage to transmit the information to comparator 30. The voltage level of the inverting input of comparator 30 corresponds to the output level of the error amplifier of the regulation loop which is, by construction, limited to a maximum voltage. As an alternative, terminal 26 may be connected to any adapted voltage reference. For example, in the case (not shown) of a regulation by a measurement at the secondary, terminal 26 is connected to the transistor of an optocoupler (or the like) to provide a current control point.

The output of comparator 30 is connected to block 25 by a switch 28 controlled by a circuit 29 (TIME GEN), the function of which is to synchronize the turning-off of switch 28 with the beginning of each on cycle of switch 6. This enables avoiding erroneous detection of current peaks at the turning-on.

A feature of the present invention is to use the result of a comparison of the current in switch 6 with a reference current to modify, if necessary, the switching frequency of the supply voltage. For this purpose, circuit 20 includes a second comparator 40, a first input of which receives an information depending on the current in switch 6 and a second input of which receives a control point associated with a limiting current (block 41, Ilim). Preferably, the control point corresponds to a fixed reference. The first input of comparator 40 is, for example, connected to an element 45 for measuring the source current in transistor 6 or exploits the result of element 31. The output of comparator 40 is connected, by a switch 42, to an integrator 43, the output of which controls a current source 44 connected between terminal 24 and the ground. The function of the integrator is to accumulate the result of the comparison between two measurement periods set by the turn-on frequency of a switch 42. Switch 42 is controlled by circuit 29, which determines a delay with respect to the turning-on of switch 6 to turn on switch 42 and, further, determines the duration of conduction of switch 42.

FIGS. 5A, 5B, 5C, 5D, 5E, and 5F illustrate, in the form of timing diagrams, the operation of a power converter according to the present invention, and more specifically of its control circuit. FIG. 5A shows an example of shape of control signal Vg of the gate of transistor 6. FIG. 5B shows an example of shape of control signal Vb of switch 28. FIG. 5C shows an example of shape of control signal Vs of switch 42. FIG. 5D shows an example of current Id in switch 6. FIG. 5E shows voltage Vi at the input of integrator 43. FIG. 5F shows current 1 set by source 44. The timing diagrams of FIG. 5 show, in their left-hand portion, a normal operating cycle, and in their right-hand portions, a cycle in case of a short-circuit.

Assume a turning-on of switch 6 at a time t1 (FIG. 5B). After a current peak (times t1 to t5) due to the switching, current Id progressively increases along the magnetization of the primary winding of the transformer until switch 6 is turned off (times t3). The duration of an on pulse of switch 6 (times t1 to t3, FIG. 5A) generally is of a few microseconds (switching frequency greater than one kilohertz).

Control signal Vb of switch 28 is normally high, that is, switch 28 is in a normally on state. Circuit 29 turns it off for a short duration (a few hundreds of nanoseconds) after each turning-on of switch 6. The duration of the low-state pulse of signal Vb, during which the control circuit does not take the comparison result of comparator 30 into account, is linked to the duration of the spurious current peak at the beginning of the magnetization cycle. The fact of not taking the spurious pulse into account has been illustrated in FIG. 5D by a plotting in dotted lines of the current peak at the beginning of the cycle. In the example of FIG. 5B, signal Vb is low between times t1 and t5. Interrupting the comparison enables avoiding activation of the current limiting means under the effect of spurious noise due to the switchings.

Switch 42 is in a normally off state, that is, signal Vs activates the turning-on when high. Thus, the result of the comparison provided by comparator 40 is only taken into account and integrated by circuit 43 during a short period in each on cycle of switch 6. The aim is to compare the current of transistor 6 with the limiting current at the beginning of each on cycle. It must however be avoided to take spurious peaks into account. Accordingly, the turning-on of switch 42 occurs at time t5 when the peak has disappeared. For example, this turning-on is simultaneous with the turning-on of switch 28. The on-state duration of signal Vs is chosen to be short as compared to the on-state duration of switch 6. For example, a duration on the order of a few hundreds of nanoseconds (times t5 to t4, FIG. 5C) enables taking into account the current at the beginning of the magnetization cycle.

The result provided by comparator 40, more specifically at the input of integrator 43, is illustrated in FIG. 5E. In normal operation, the current increases from the origin, that is, a complete demagnetization is performed for each cycle. Accordingly, the result of the comparison does not indicate that the limiting current threshold has been exceeded. Current 1 in source 44 is then unmodified.

In case of a short-circuit (right-hand portion of FIG. 5), the same time intervals are present. They are identified by the same references as in the left-hand portion of the timing diagrams, with an apostrophe ('). Since the secondary is short-circuited, the demagnetization is not complete. As a result, after a significant current peak (times t'1 to t'5), the current increase in the primary winding of the transformer does not start from zero but from a short-circuit value Icc. If this value is greater than current Ilim, the result provided by comparator 40 is positive and integrator 43 modifies the control of current source 44. This results in an increase of current 1 from time t'5. This increase is progressive under the effect of the pulse integration (times t'5 to t'4) performed by integrator 43. From time t'4, current 1 is constant until the next cycle.

FIG. 6 illustrates, with a different scale, three successive cycles where the secondary of the transformer remains in short-circuit. Current 1 increases by steps until reaching the maximum current of source 44, set by construction.

The increase of current 1 sampled from terminal 24 decreases the frequency provided by block 27. Accordingly, the switching frequency of switch 6 is decreased, which enables achieving again a complete demagnetization thereof.

The example shown in the right-hand portion of the timing diagrams of FIG. 5 does not correspond to the cycle in which the short-circuit occurs. Indeed, a few cycles are necessary for the lack of demagnetization of the transformer to have it switch to a continuous mode.

The choice of the predetermined value Ilim of the current beyond which a lack of demagnetization is considered depends on the application and, in particular, on whether it is desired to allow or not for a continuous operating mode for the transformer.

By choosing a sufficiently low current Ilim, the switching to a continuous mode is forbidden. Indeed, current source 44 will be activated as soon as the current in switch 6 will not start from the origin. The chosen threshold however depends on the duration of the detection pulse.

According to a preferred embodiment of the present invention, the switching to a continuous mode of the transformer is allowed while limiting the current therethrough. This amounts to allowing for the continuous mode until a given threshold. In this case, the value of current Ilim is, preferably, between one quarter and three quarters (for example, one half) of the maximum current desired for the transformer.

An advantage of maintaining an operation in continuous mode is that the converter can then be used in bi-voltage applications.

An advantage of the present invention is that the provided solution is entirely integrable without requiring any additional terminal as compared to a conventional VIPER integrated circuit.

Another advantage of the present invention is that even in normal operation, that is, as long as maximum value Imax of the current set by comparator 30 has not been reached, the transformer is already protected by the choice of a limiting value Ilim smaller than this maximum value.

The influence of current source 44 may be adapted on the oscillation frequency by modifying the value of resistance R3. By choosing a relatively low resistance R3, an oscillation is guaranteed even when current source 44 has reached its maximum current. By choosing a relatively large resistance R3, the oscillation can stop, for example, when the value of current 1 has reached the maximum that the source can provide.

An advantage of the present invention thus is that a minimum switching frequency can be set.

Another advantage is that the starting of the power converter is then improved. Indeed, at the circuit starting, the capacitor (C2, FIG. 1) of the secondary of the transformer is entirely discharged. The converter then temporarily behaves as a short-circuit. The implementation of the present invention enables limiting the current for the first milliseconds of converter operation.

Of course, the present invention is likely to have various alterations, modifications, and improvement which will readily occur to those skilled in the art. In particular, the practical implementation of the comparison, integration, and current source functions are within the abilities of those skilled in the art based on the functional indications given hereabove. Further, the choice of the thresholds to be applied and of the component values depend on the application and on the authorization or not of the continuous operation mode, and will thus be adapted by those skilled in the art.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A circuit for controlling a switch for a switched supply voltage of a primary winding of a power converter transformer, comprising:
   means for detecting a current in the switch in an on state after a predetermined time that follows each turning-on of the switch;
   a first comparator for limiting the detected current; and
   a second comparator of the current with respect to a threshold, the result of the second comparator being taken into account for a predetermined duration in a vicinity of a beginning of an on cycle of the switch.

2. The control circuit of claim 1, wherein the result is taken into account with a predetermined delay with respect to the beginning of the on cycle of the switch.

3. The circuit of claim 1, further comprising means for modifying a frequency of the supply voltage according to the result provided by the second comparator.

4. The circuit of claim 1, wherein the circuit for controlling the switch is integrated with the switch.

5. The circuit of claim 1, wherein the current threshold is chosen to allow or not the operation of the converter in continuous mode.

6. A voltage converter including a circuit for controlling a switch for providing current to a primary winding of a transformer with inverted phase points, a winding of which is associated with a capacitor for providing a regulated D.C. output voltage, including the control circuit of claim 1.

7. The converter of claim 6, wherein an input terminal of the control circuit intended for setting an oscillation voltage is connected to a supply voltage by a resistor, the value of which is chosen according to a desired minimum switching frequency.

8. A method for controlling a switch for a switched supply voltage of a primary winding of a power converter transformer, comprising:
   comparing a current in the switch to a threshold;
   modifying an oscillation frequency for a predetermined duration in a vicinity of a beginning of an on cycle of the switch, based on the comparison of the current in the switch to the threshold; and
   modifying a control pulse applied to the switch, based on the oscillation frequency, thereby controlling the switch.

9. The method of claim 8, wherein modifying the oscillation frequency for a predetermined duration in the vicinity of the beginning of the on cycle of the switch, based on the comparison of the current in the switch to the threshold, occurs after a predetermined delay with respect to the beginning of the on cycle of the switch.

10. The method of claim 9, wherein modifying the oscillation frequency for a predetermined duration in the vicinity of the beginning of the on cycle of the switch, based on the comparison of the current in the switch to the threshold, comprises controlling a current that modifies the oscillation frequency.

11. The method of claim 10, wherein modifying the current that modifies the oscillation frequency comprises integrating the comparison of the current in the switch to the threshold.

12. The method of claim 11, wherein modifying the control pulse applied to the switch, based on the oscillation frequency, comprises modifying a width of the control pulse applied to the switch.

13. The method of claim 8, further comprising modifying a frequency of the supply voltage according to the modification of the control pulse applied to the switch.

14. The method of claim 8, wherein the threshold is chosen to allow or not the operation of the converter in continuous mode.

15. The method of claim 8, wherein the threshold is between one quarter and three quarters of a maximum current in the primary winding of the power converter transformer.

16. The method of claim 8, wherein modifying the oscillation frequency for the predetermined duration in the vicinity of the beginning of the on cycle of the switch, based on the comparison of the current in the switch to the threshold, comprises controlling a current that modifies the oscillation frequency.

17. The method of claim 16, wherein modifying the current that modifies the oscillation frequency comprises integrating the comparison of the current in the switch to the threshold.

18. The method of claim 17, wherein modifying the control pulse applied to the switch, based on the oscillation frequency, comprises modifying a width of the control pulse applied to the switch.

* * * * *

UNITED STATES PATENT AND TRADEMARK OFFICE
CERTIFICATE OF CORRECTION

| | | |
|---|---|---|
| PATENT NO. | : 7,054,171 B1 | |
| APPLICATION NO. | : 10/381,967 | |
| DATED | : May 30, 2006 | |
| INVENTOR(S) | : Alain Bailly and Jean Barrett | |

It is certified that error appears in the above-identified patent and that said Letters Patent is hereby corrected as shown below:

Col. 2, line 55 should read:
voltage VAUX, of current 1 in switch 6 and of local supply Col. 6, line 46 should read:
5F shows current 1 set by source 44. The timing diagrams of Col. 7, lines 26-26 should read:
that the limiting current threshold has been exceeded. Current 1 in source 44 is then unmodified.

line 38 should read:
current 1 from time t'5. This increase is progressive under line 40 should read:
by integrator 43. From time t'4, current 1 is constant until the line 44 should read:

line short-circuit. Current 1 increases by steps until reaching the line 46 should read:
The increase of current 1 sampled from terminal 24 line 56 should read:
The choice of the predetermined value Him of the current

UNITED STATES PATENT AND TRADEMARK OFFICE
CERTIFICATE OF CORRECTION

PATENT NO.        : 7,054,171 B1
APPLICATION NO. : 10/381,967
DATED             : May 30, 2006
INVENTOR(S)       : Alain Bailly and Jean Barrett It is certified that error appears in the above-identified patent and that said Letters Patent is hereby corrected as shown below:

Col 8, line 25 should read:
value of current 1 has reached the maximum that the source Signed and Sealed this Eleventh Day of September, 2007

JON W. DUDAS
*Director of the United States Patent and Trademark Office*